(12) United States Patent
Sakai et al.

(10) Patent No.: US 8,272,882 B2
(45) Date of Patent: Sep. 25, 2012

(54) SEMICONDUCTOR DEVICE SOCKET

(75) Inventors: Tooru Sakai, Yokohama (JP); Kuniyoshi Koumi, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 104 days.

(21) Appl. No.: 12/810,835

(22) PCT Filed: Dec. 27, 2007

(86) PCT No.: PCT/JP2007/075141
§ 371 (c)(1),
(2), (4) Date: Jun. 25, 2010

(87) PCT Pub. No.: WO2009/084085
PCT Pub. Date: Jul. 9, 2009

(65) Prior Publication Data
US 2011/0171840 A1  Jul. 14, 2011

(51) Int. Cl.
*H01R 12/00* (2006.01)
*H01R 13/15* (2006.01)
(52) U.S. Cl. .......................... 439/81; 439/268
(58) Field of Classification Search .................. 439/266, 439/63, 140, 264, 83, 81, 268
See application file for complete search history.

(56) References Cited

U.S. PATENT DOCUMENTS

| | | | | |
|---|---|---|---|---|
| 4,410,223 A | * | 10/1983 | Baker | 439/81 |
| 4,682,829 A | * | 7/1987 | Kunkle et al. | 439/83 |
| 4,775,917 A | * | 10/1988 | Eichhorn et al. | 361/708 |
| 4,828,503 A | * | 5/1989 | Gilissen et al. | 439/62 |
| 4,898,539 A | * | 2/1990 | Glover et al. | 439/81 |
| 5,076,796 A | * | 12/1991 | Kusayanagi et al. | 439/83 |
| 5,124,880 A | * | 6/1992 | Okamoto et al. | 361/306.1 |
| 5,145,384 A | * | 9/1992 | Asakawa et al. | 439/78 |
| 5,167,513 A | * | 12/1992 | Johnson et al. | 439/78 |
| 5,201,663 A | * | 4/1993 | Kikuchi et al. | 439/83 |

(Continued)

FOREIGN PATENT DOCUMENTS

DE          4319756          * 12/1994

(Continued)

OTHER PUBLICATIONS

Official Notice of Rejection from Korean Patent Office in Korean Patent Application No. 10-2010-7013958, dated Sep. 27, 2011 and English translation thereof. (8 pages including 3 pages of communication and 5 pages of translation.).

(Continued)

*Primary Examiner* — Neil Abrams
(74) *Attorney, Agent, or Firm* — Finnegan, Henderson, Farabow, Garrett & Dunner, LLP.

(57) ABSTRACT

A contact terminal (26*ai*) comprises: a pair of movable side contact pieces (26M) and (26F) which pinch or release a ball-like electrode portion (DVa) of a semiconductor device (DV); a fixed side terminal (26T) having on one end a contact point (26*te*) coming into contact with an electrode group (PBE) of a printed wiring board (PB); and a fixing portion (26C) which connects proximal end portions of the pair of elastic movable side contact pieces (26M) and (26F) to the other end of the fixed side terminal (26T). The fixed side terminal (26T) formed into a curved shape is elastic and has the one end thereof joined to the fixing portion (26C). The fixed side terminal (26T) is formed of a plurality of curved portions (26*ta*, 26*tb*, 26*tc*, and 26*td*) and the contact point (26*te*) provided continuous with one another.

6 Claims, 20 Drawing Sheets

U.S. PATENT DOCUMENTS

| | | | |
|---|---|---|---|
| 5,342,213 A | 8/1994 | Kobayashi | |
| 5,342,214 A | 8/1994 | Hsu | |
| 5,519,882 A | 5/1996 | Asano et al. | |
| 5,611,705 A | 3/1997 | Pfaff | |
| 5,683,255 A * | 11/1997 | Menze | 439/63 |
| 5,713,745 A * | 2/1998 | Sakurai et al. | 439/78 |
| 5,746,608 A * | 5/1998 | Taylor | 439/70 |
| 5,800,184 A * | 9/1998 | Lopergolo et al. | 439/66 |
| 5,885,101 A | 3/1999 | Matsuoka et al. | |
| 5,975,921 A * | 11/1999 | Shuey | 439/83 |
| 6,027,344 A | 2/2000 | Johanns et al. | |
| 6,093,053 A * | 7/2000 | Horioka et al. | 439/444 |
| 6,095,827 A * | 8/2000 | Dutkowsky et al. | 439/83 |
| 6,099,326 A * | 8/2000 | Lin | 439/83 |
| 6,126,467 A | 10/2000 | Ohashi | |
| 6,132,222 A * | 10/2000 | Wang et al. | 439/70 |
| 6,155,856 A * | 12/2000 | Sanada | 439/246 |
| 6,193,524 B1 * | 2/2001 | Chang | 439/66 |
| 6,261,114 B1 | 7/2001 | Shimada | |
| 6,328,587 B1 | 12/2001 | Hsu | |
| 6,371,782 B1 | 4/2002 | Ohashi | |
| 6,383,002 B1 | 5/2002 | Ohashi | |
| 6,402,537 B2 | 6/2002 | Ikeya | |
| 6,461,182 B1 | 10/2002 | Hsu | |
| 6,464,511 B1 | 10/2002 | Watanabe et al. | |
| 6,567,866 B1 | 5/2003 | Poisner | |
| 6,609,923 B2 | 8/2003 | Sato et al. | |
| 6,764,317 B2 * | 7/2004 | Tsai | 439/81 |
| 6,776,643 B2 | 8/2004 | Nakano | |
| 6,793,512 B2 | 9/2004 | Abe et al. | |
| 6,796,823 B1 | 9/2004 | Nakano et al. | |
| 6,860,766 B2 * | 3/2005 | Aujla et al. | 439/733.1 |
| 6,866,552 B2 * | 3/2005 | Koehler | 439/892 |
| 7,134,892 B2 | 11/2006 | Hayakawa | |
| 7,311,528 B2 * | 12/2007 | Jiten | 439/70 |
| 7,322,834 B2 * | 1/2008 | Hu et al. | 439/83 |
| 7,403,024 B2 * | 7/2008 | Maruyama et al. | 324/755.05 |
| 7,601,018 B2 * | 10/2009 | Hwang | 439/331 |
| 7,618,277 B2 | 11/2009 | Sato | |
| 7,753,704 B2 * | 7/2010 | Chen | 439/268 |
| 2003/0162446 A1 * | 8/2003 | Ho et al. | 439/660 |

FOREIGN PATENT DOCUMENTS

| | | |
|---|---|---|
| EP | 0213819 A2 | 3/1987 |
| JP | 57-125632 | 1/1984 |
| JP | 02-049381 | 2/1990 |
| JP | 02-119378 | 5/1990 |
| JP | 04-072927 | 3/1992 |
| JP | 04-135190 | 12/1992 |
| JP | 05-047445 | 2/1993 |
| JP | 07-239362 | 9/1995 |
| JP | 08-273777 | 10/1996 |
| JP | 9-55273 | 2/1997 |
| JP | 09-92421 | 4/1997 |
| JP | 10-073635 | 3/1998 |
| JP | 11-002126 | 1/1999 |
| JP | 02-973406 | 9/1999 |
| JP | 2000-048923 | 2/2000 |
| JP | 2000-133390 | 5/2000 |
| JP | 2000-182740 | 6/2000 |
| JP | 03-072548 | 8/2000 |
| JP | 2001-043462 | 2/2001 |
| JP | 2001-043947 | 2/2001 |
| JP | 2001-066346 | 3/2001 |
| JP | 2001-151234 | 5/2001 |
| JP | 2001-217054 | 8/2001 |
| JP | 03-257994 | 12/2001 |
| JP | 2002-359045 | 12/2002 |
| JP | 2003-17207 | 1/2003 |
| JP | 2003-123925 | 4/2003 |
| JP | 2005-228716 | 8/2005 |
| JP | 2006-71375 | 3/2006 |
| JP | 2006-127937 | 5/2006 |
| KR | 20-1999-0035774 | 9/1999 |

OTHER PUBLICATIONS

English-language International Search Report from the Japanese Patent Office mailed Apr. 8, 2008, for International Application No. PCT/JP2007/075141.

Official Action dated Feb. 6, 2008 in corresponding German Patent Application No. 10228291.9-22 (5 pages).

Official Letter from Korean Patent Office, dated Sep. 18, 2004, for corresponding Korean Patent Application No. 10-2002-0038155 (5 pages).

* cited by examiner

SEMICONDUCTOR DEVICE SOCKET

TECHNICAL FIELD

The present invention relates to a semiconductor device socket for electrically connecting a semiconductor device that undergoes a test to a printed wiring board.

BACKGROUND ART

Generally, a semiconductor device to be mounted on an electronic device or the like undergoes, for example, a burn-in test, which is deemed to be effective for eliminating an integrated circuit having an infant mortality failures, by use of a semiconductor device socket in order to eliminate a potential defect of the semiconductor device at a stage before the semiconductor device is mounted.

A semiconductor device socket used for the test is generally referred to as an IC socket and is disposed on a printed wiring board (a test board) as shown in Patent Document 1, for example. The printed wiring board is provided with an input-output unit for receiving and supplying signals. The input-output unit is assumed to receive a supply of a predetermined test voltage and to send an anomaly detection signal representing a short circuit or the like outputted from a semiconductor device as an object to be tested.

At that time, a socket body of the IC socket is fastened to the printed wiring board with attachment screws and nuts through a plurality of mounting holes provided in the printed wiring board, for example. In addition, a plurality of IC sockets may be densely disposed on a single printed wiring board in order to improve inspection efficiency on an inspection line.

Such an IC socket incorporates inside its socket body a contact terminal group configured to electrically connect terminals of the semiconductor device to the input-output unit of the printed wiring board. As also shown in Patent Document 1, for example, each of contact terminals constituting the contact terminal group is configured by comprising: a pair of movable pieces configured to pinch or release a terminal of the semiconductor device; a fixed terminal portion to be fixed to the printed wiring board; and a connecting portion configured to connect the fixed terminal portion to a junction of proximal end portions of the pair of mutually opposed movable pieces. The fixed terminal portion of each contact terminal is generally soldered and fixed to each plated-through-hole of the printed wiring board.

In addition, as shown in Patent Document 2 as well, there is proposed an IC socket in which a plurality of contact terminals include: a first contact terminal that is one having a curved fixed terminal which comes into contact with a contact pad on the printed wiring board instead of each plated-through-hole on the printed wiring board; and a second contact terminal that is one having a curved fixed terminal which comes into contact with a contact pad on the printed wiring board, and having an anchor pin being inserted to the plated-through-hole of the printed wiring board.

Patent Document 1: Japanese Patent Laid-Open No. 2003-123925

Patent Document 2: Japanese Patent Laid-Open No. 2003-17207

Patent Document 3: Japanese Patent Laid-Open No. 2006-071375

DISCLOSURE OF THE INVENTION

In a case where a plurality of IC sockets are densely disposed on a single printed wiring board as shown in Patent Document 1 and Patent Document 2 described above, if one of the a plurality of IC sockets is defective, maintenance and inspection operations or a replacement work for the IC socket that is defective may prevent the use of the rest of IC sockets disposed on the same printed wiring board and deemed to be non-defective, for a certain period of time.

In such a case, it is also conceivable to prepare a spare test board provided with similar IC sockets in order to execute inspection continuously without interrupting the inspection on the inspection line for a relatively long period of time.

To prepare the spare test board, however, is inadvisable because of an increase in equipment costs on the inspection line. In addition, a soldering operation for the fixed terminals of the contact terminals consumes a relatively long period of time for a replacement operation, and moreover, the test board may be broken, leading to a drop in yield. Accordingly, there is a demand for quickly replacing only the defective IC socket with an easy work without the need of the soldering operation.

In addition, it is also conceivable in the existing IC socket to change all the contact terminals into the above-described first contact terminals shown in Patent Document 2, for example, without changing a height from a surface of the test board to an uppermost end of the IC socket in order to eliminate the need for the soldering operation. However, in the case of the above-described curved fixed terminal, it is difficult to adjust a spring constant because of the above-mentioned height restriction. Hence there is a risk that an excessive contact pressure is applied to the contact pad on the printed wiring board.

In view of the above-described problems, the present invention aims to provide a semiconductor device socket for electrically connecting a semiconductor device that undergoes a test to a printed wiring board. The semiconductor device socket can replace only a defective IC socket with an easy work and in a short period of time, and prevent a fixed terminal portion of a contact terminal from applying an excessive contact pressure on a contact pad of a printed wiring board.

To achieve the above-described object, a semiconductor device socket according to the present invention comprises: a socket body being disposed on a wiring board having an electrode surface on which an electrode group is formed, the socket body having a semiconductor device accommodating portion in which a semiconductor device is housed detachably and attachably; a contact terminal being disposed on said socket body, said contact terminal having a pair of movable side contact pieces, a fixed side terminal, and a fixed portion, said contact terminal for connecting a terminal of the semiconductor device electrically to the electrode surface of the wiring board, the pair of movable side contact pieces being elastic and pinching the terminal of the semiconductor device, the fixed side terminal having a plurality of curved portions formed to be continuous with each of the contact pieces and elastically displaceable in a direction orthogonal to the electrode surface of the wiring board and a contact point which comes into contact with the electrode surface of the wiring board, the fixed portion for connecting proximal end portions of the pair of movable side contact pieces of said contact terminal to another end of the fixed side terminal; a slider member having a pressing portion which moves at least one movable side contact piece of the paired movable side contact pieces of said contact terminal so as to cause the one movable side contact piece to approach or to separate from the other movable side contact piece each other; and a slider driving mechanism which causes the pressing portion of said slider member operate so that the pair of movable side contact pieces of said contact terminal are brought into contact with or separated from the terminal of the semiconductor device, wherein an end of the curved portions is integrally formed with a side face portion of the fixing portion.

Therefore, according to the semiconductor device socket of the present invention, the contact terminal comprises a pair of movable contact pieces being elastic and pinching a terminal of the semiconductor device, a fixed side terminal having a curved portion and a contact point on one end of the curved portion, and a fixed portion for connecting proximal end portions of the pair of movable side contact pieces of the contact terminal to another end of the fixed side terminal, the curved portion formed to be continuous with each of the movable contact pieces and elastically displaceable in a direction orthogonal to the electrode surface of the wiring board, the contact point coming into contact with the electrode surface of the wiring board, the contact terminal for connecting the terminal of the semiconductor device electrically to the electrode surface of the wiring board. Accordingly, the semiconductor device socket of the present invention can replace only a defective IC socket with an easy operation and in a short period of time and prevent the fixed terminal portion of the contact terminal from applying an excessive contact pressure on a contact pad of the printed wiring board.

BEST MODES FOR CARRYING OUT THE INVENTION

Figure 3:
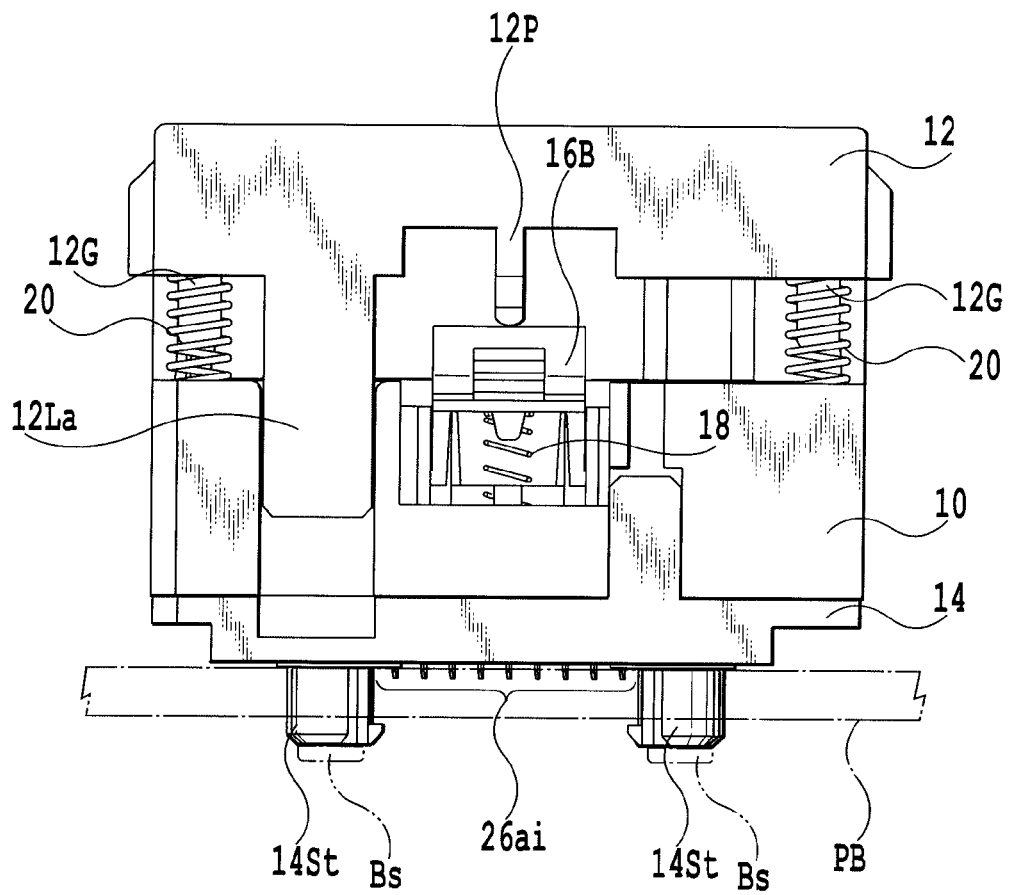
FIG. 3 is a front view of the example shown in FIG. 2.

FIG. 3 shows an enlarged view of an example of a semiconductor device socket according to the present invention together with a printed wiring board serving as a test board. Besides, FIG. 3 represents one of a plurality of semiconductor device sockets to be disposed on the printed wiring board.

The semiconductor device sockets are of an open top type, for example, and are respectively disposed in predetermined positions on a conductive pattern formed on a printed wiring board PB having a predetermined board thickness. An electrode group PBE with which contact points of fixed side terminals of contact terminals to be described later are brought into contact is formed in a predetermined position on the conductive pattern as enlarge in FIG. 18A and FIG. 18B. In addition, substantially circular shaped holes (not shown) into which each fixed nib portions of the semiconductor device sockets to be described later are inserted are formed around the conductive pattern. Besides, the shape of the holes is not limited to the aforementioned example and may be rectangular holes or of any other shapes, for example.

As shown in FIG. 3, the semiconductor device socket comprises as principal elements: an alignment plate 14 to be detachably/attachably fixed onto the above-described printed wiring board PB; a socket body 10 to be provided on the alignment plate 14; a plurality of contact terminals 26$ai$ (i=1 to n, n is a positive integer) arranged in a contact accommodating portion in the center in the socket body 10 and configured to electrically connect a semiconductor device DV (see FIG. 18A) to be described later to the conductive pattern on the printed wiring board PB; a cover member 12 supported by the socket body 10 so as to be vertically movable and configured to transmit an operating force to a latch mechanism to be described later; a slider member 24 (see FIG. 6) provided with a positioning portion 22 which is configured to house the semiconductor device DV detachably/attachably and positions electrode portions of the semiconductor device DV relative to the contact terminals; and a latch mechanism including pressing members 16A and 16B which are configured to press the electrode portions of the semiconductor device DV housed in the positioning portion 22 against the plurality of contact terminals to retain the semiconductor device DV.

The semiconductor device DV to be placed on the above-described semiconductor device socket is designed as a substantially square semiconductor device of a BGA type, for example, and has an electrode surface on which a plurality of ball-like electrode portions DVa are formed in a matrix.

Figure 5:
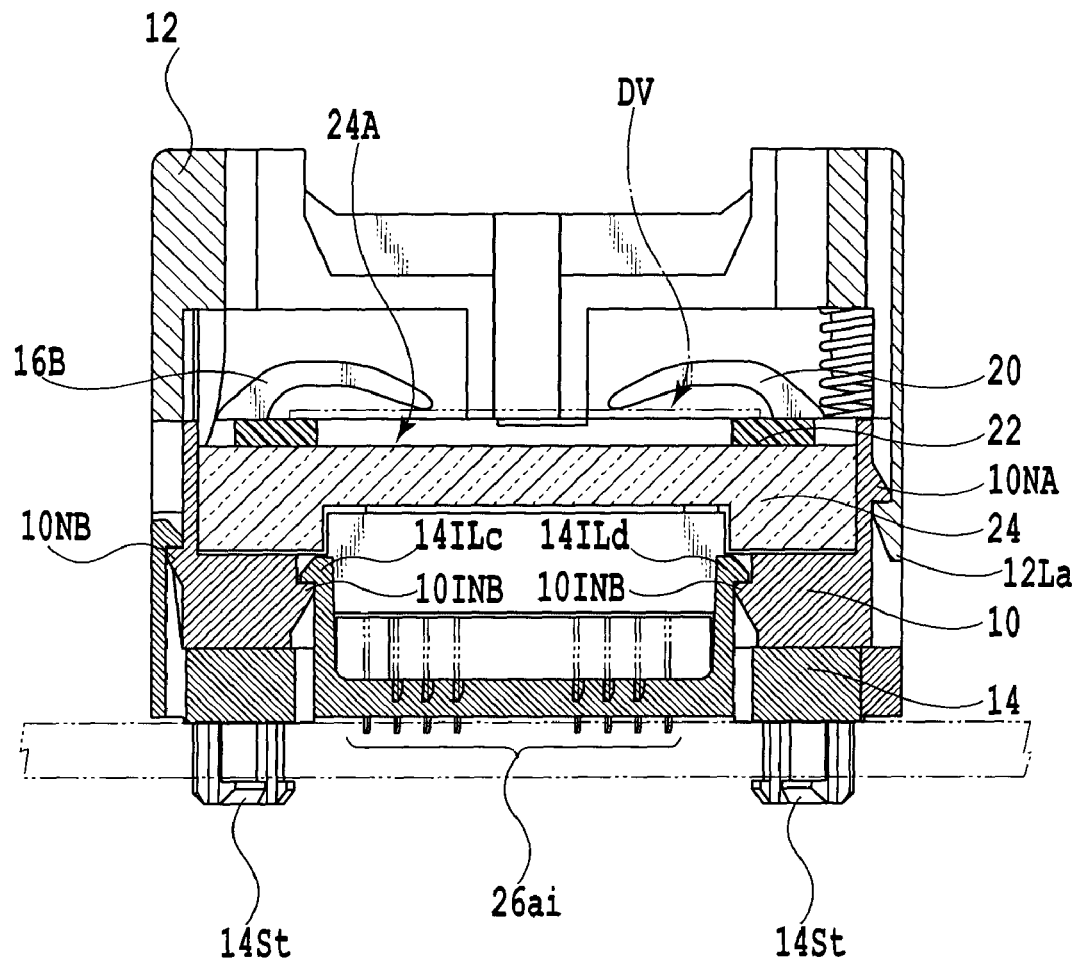
FIG. 5 is a cross-sectional view shown along a line V-V of FIG. 2.
Figure 7:
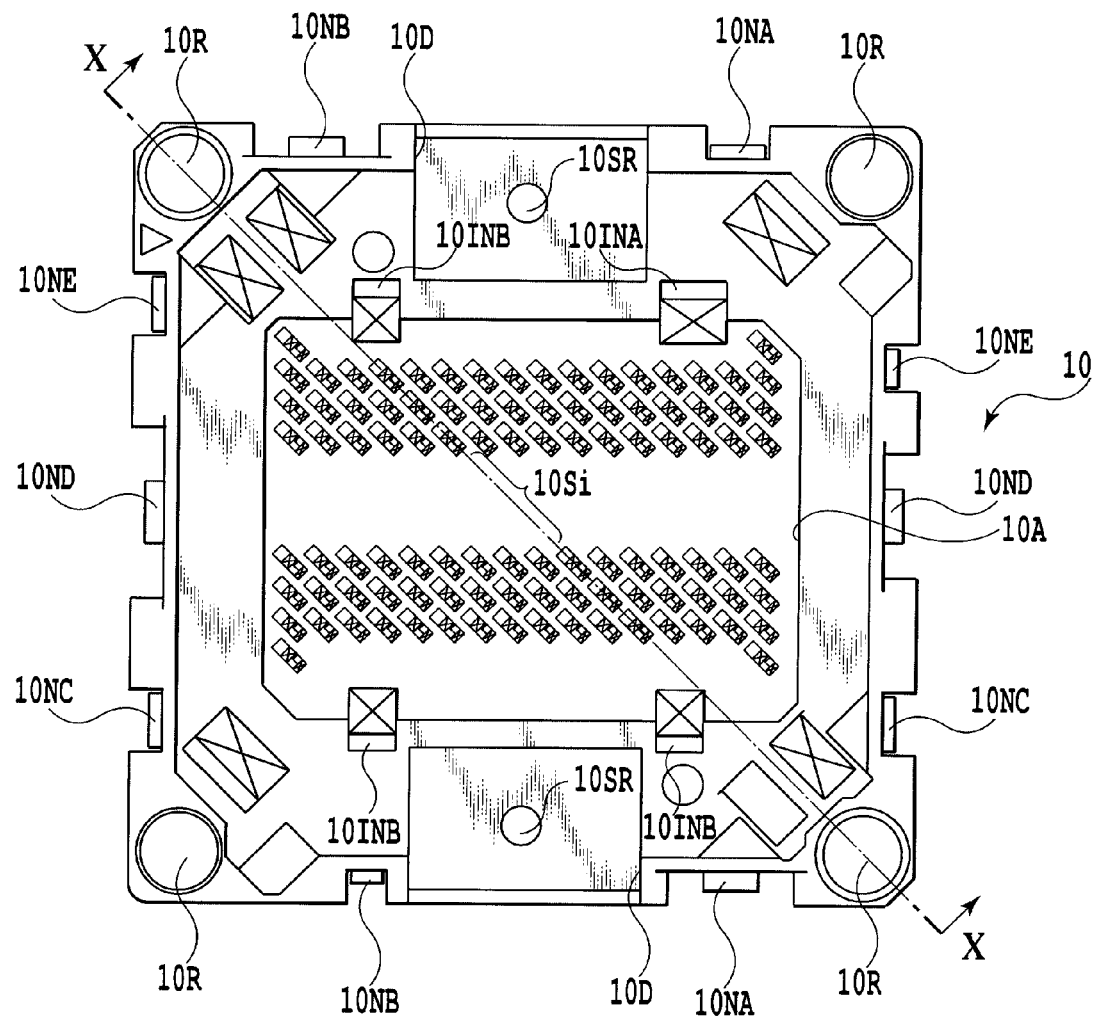
FIG. 7 is a plan view showing a socket body used in the example shown in FIG. 2.
Figure 8:
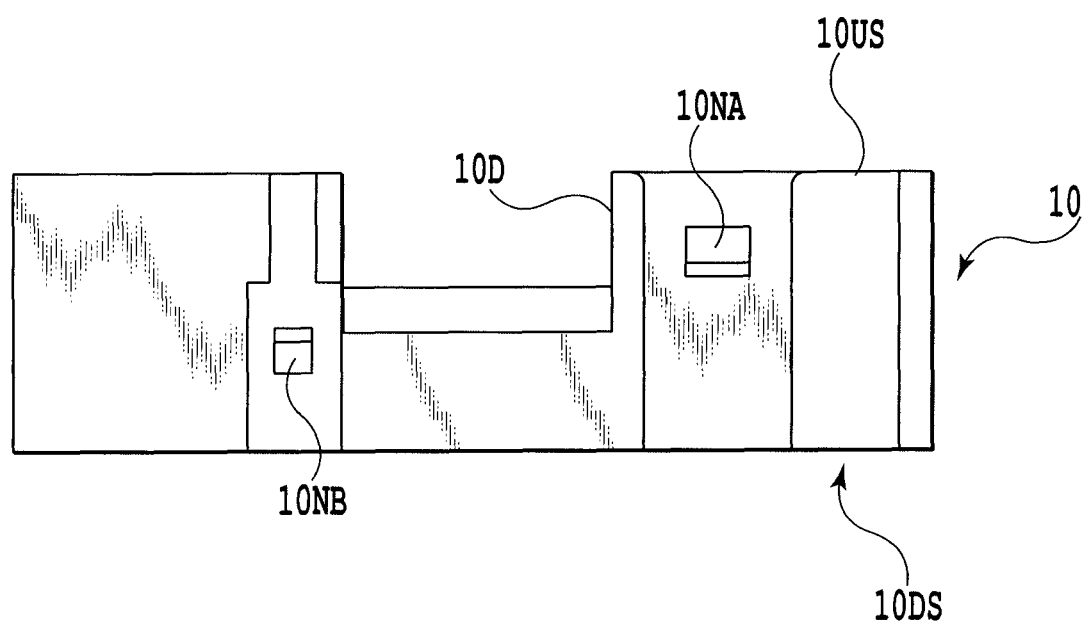
FIG. 8 is a front view of FIG. 7.

As enlarged in FIG. 5, FIG. 7, and FIG. 8, the socket body 10 made of resin has concave portions 10D on its ends which are opposed to each other. Into each of the concave portions 10D, a lower end of an arm portion 12P of the cover member 12 and a proximal end portion of the pressing member 16A or 16B enter as the cover member 12 to be described later is caused to descend. Protrusions 10SR each of which receives an end of a coil spring 18 to be described later are formed at a bottom surface portion of the socket body 10 which forms the concave portions 10D. It is to be noted that notwithstanding the above-described example, the end of the coil spring 18 may be received by a hole formed inside the concave portion 10D instead.

Figure 6:
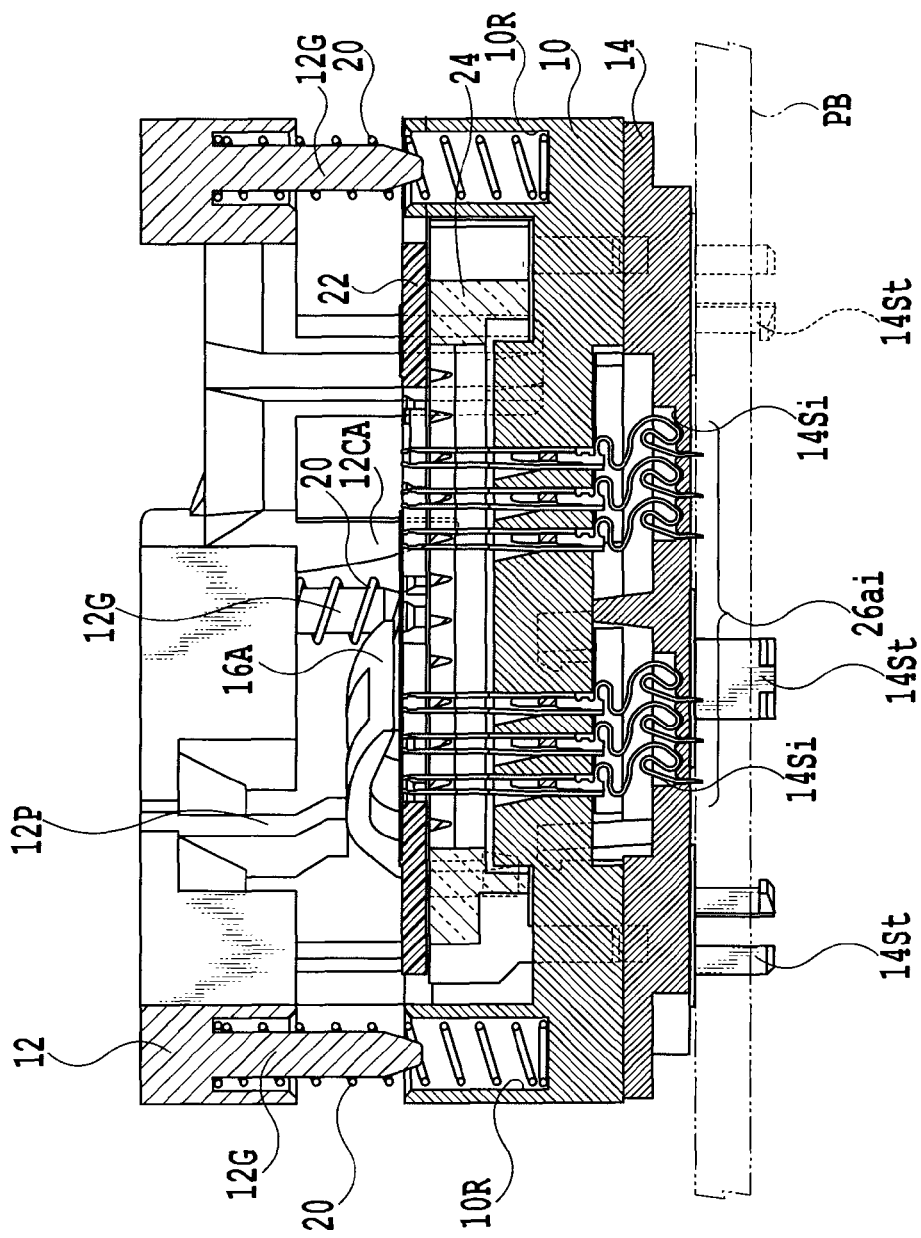
FIG. 6 is a cross-sectional view shown along a line VI-VI of FIG. 2.
Figure 9:
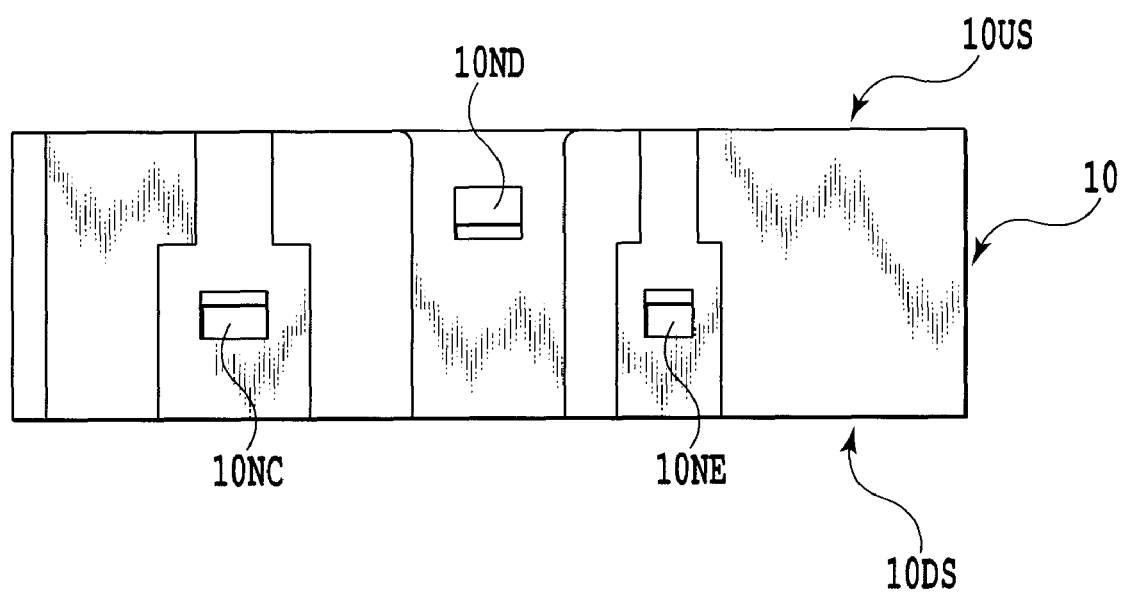
FIG. 9 is a side view of FIG. 7.

In addition, as shown in FIG. 6 and FIG. 7, holes 10R each having a predetermined depth and being configured to allow an end of the coil spring 20 as hereinafter defined to be placed therein are formed at respective portions near corners of the socket body 10. As shown in FIG. 7 and FIG. 8, on a pair of sides, which are opposed to each other, among peripheral surfaces of the socket body 10, protrusions 10NA and 10NB to which nib portions on the alignment plate 14 as hereinafter defined are fixed respectively are formed at a given interval inside guide grooves, respectively. As shown in FIG. 7 and FIG. 9, also on the other pair of sides, which are opposed to each other, among peripheral surfaces of the socket body 10, protrusions 10NC, 10ND, and 10NE to which nib portions on the alignment plate 14 as hereinafter defined are fixed respectively are also formed at given intervals inside guide grooves, respectively.

Further, as shown in FIG. 7, a contact accommodating portion 10A in which the plurality of contact terminals 26ai are arranged so as to correspond to the electrode portions of the semiconductor device DV is formed in the center inside the socket body 10. As shown in FIG. 5 and FIG. 7, nibs 10INA and 10INB to which nib portions 14ILa to 14ILd of the alignment place as hereinafter defined are fixed are formed around through-holes which are provided with intervals in four positions of a peripheral portion of the contact accommodating portion 10A.

The contact accommodating portion 10A comprises a concave portion which is open to a surface of the alignment plate 14, and a plurality of cells 10Si (i=1 to n, n is a positive integer) communicated with the concave portion and configured to house the contact terminals 26ai. In FIG. 7, the cells 10Si are formed at given intervals on a diagonal line connecting chamfered corners of the socket body 10 and on straight lines formed substantially in parallel to this diagonal line at given intervals.

Figure 10:
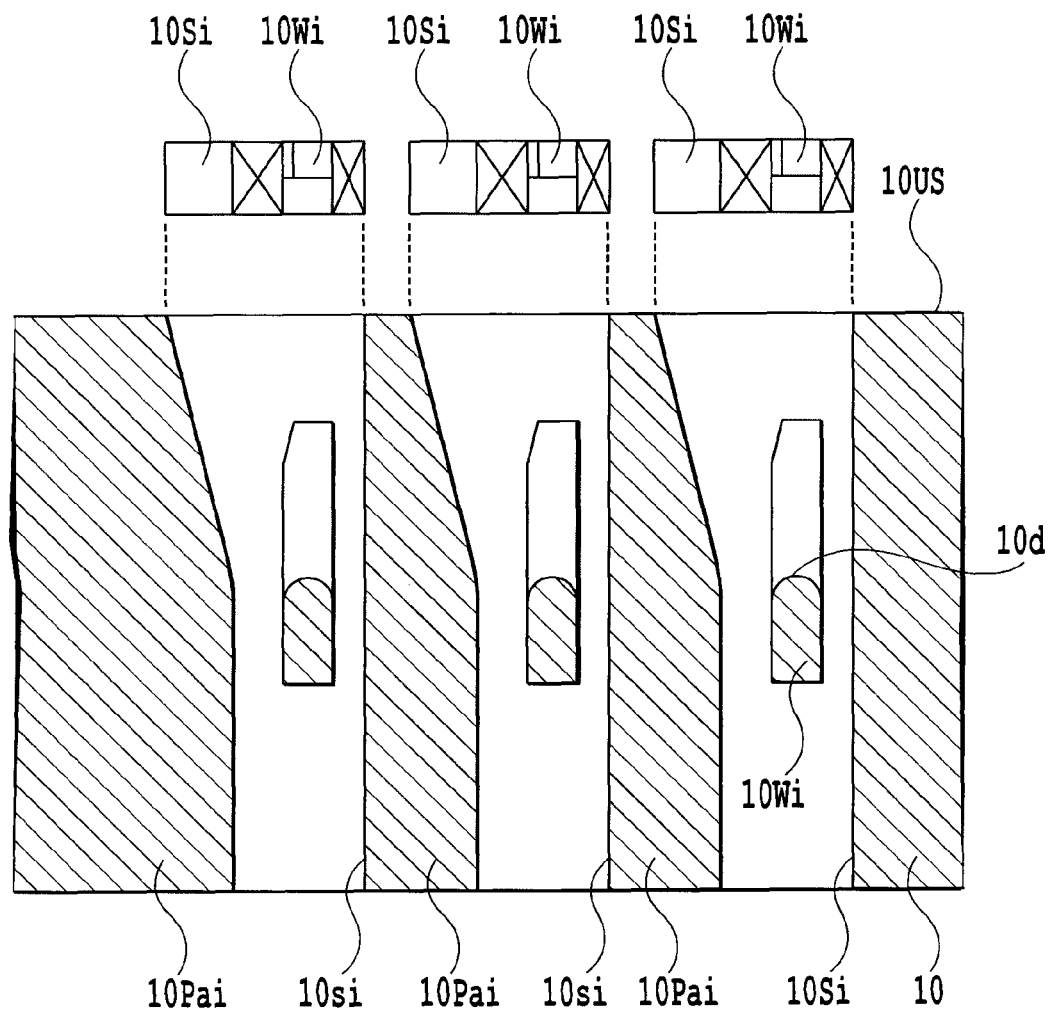
FIG. 10 is a partial cross-sectional view shown along a line X-X of FIG. 7.

As enlarged in FIG. 10, any adjacent two of cells 10Si formed at the given interval on a common straight line are partitioned by a partition wall 10Pai (i=1 to n, n is a positive integer) which extends in an almost orthogonal direction relative to a surface of the printed wiring board PB. An end of the partition wall 10Pai is tapered as it extends toward an upper surface portion of the contact accommodating portion.

Figure 11:
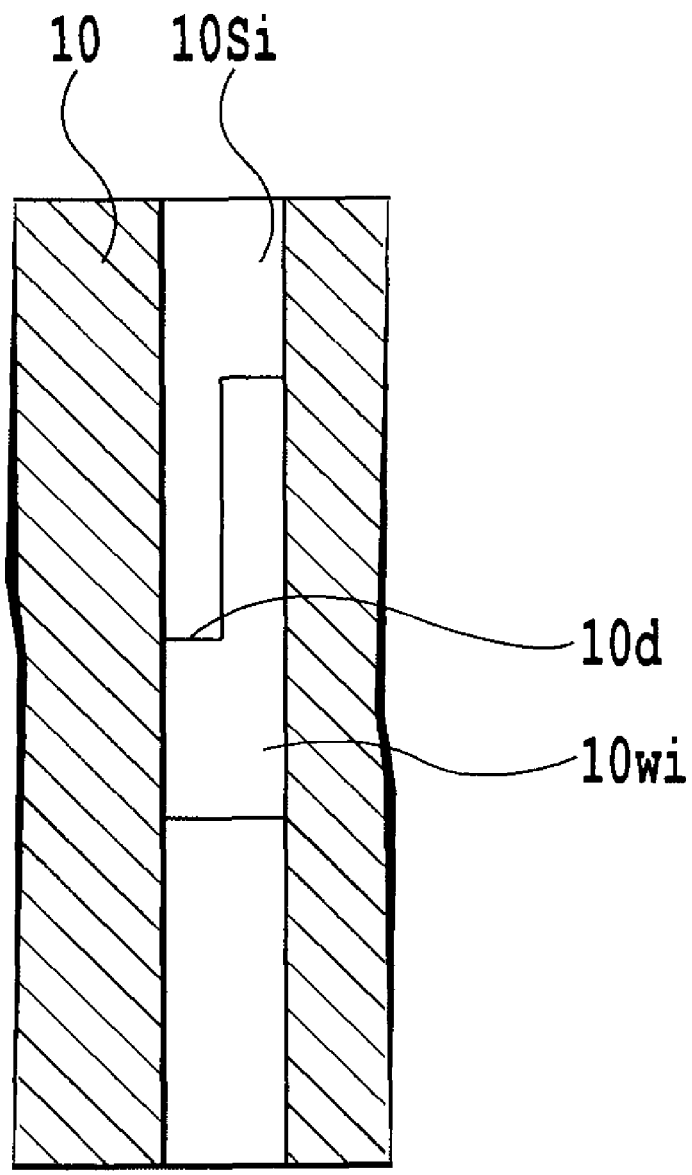
FIG. 11 is a partial cross-sectional view showing an intermediate wall in FIG. 10.
Figure 17A:
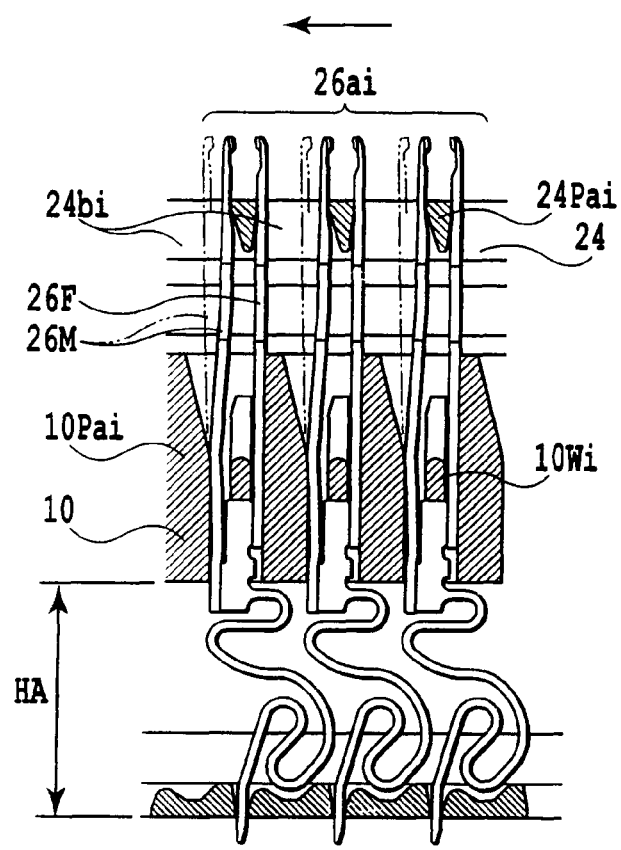
FIG. 17A is a partial cross-sectional view partially showing a configuration of the socket body in the example shown in FIG. 2.

As shown in FIG. 10 and FIG. 17A, press-fitting portions configured to support a fixing portion 26C of the contact terminal 26ai by use of their wall surfaces are formed on both sides of a intermediate wall 10Wi (i=1 to n, n is a positive integer) which are formed so as to divide an inside portion of each of the cells 10Si. As enlarged in FIG. 11, the intermediate wall 10Wi extending in an almost orthogonal direction relative to the surface of the printed wiring board PB has a cutout portion 10d formed by cutting out a portion facing one of the wall surfaces.

A flat surface 10US, on which the slider member 24 to be described later is movably provided, is formed on an upper surface portion of the contact accommodating portion to which open ends of the cells 10Si are open, the flat surface 10US being opposed with a lower surface 10DS.

Figures 1A, 1B:
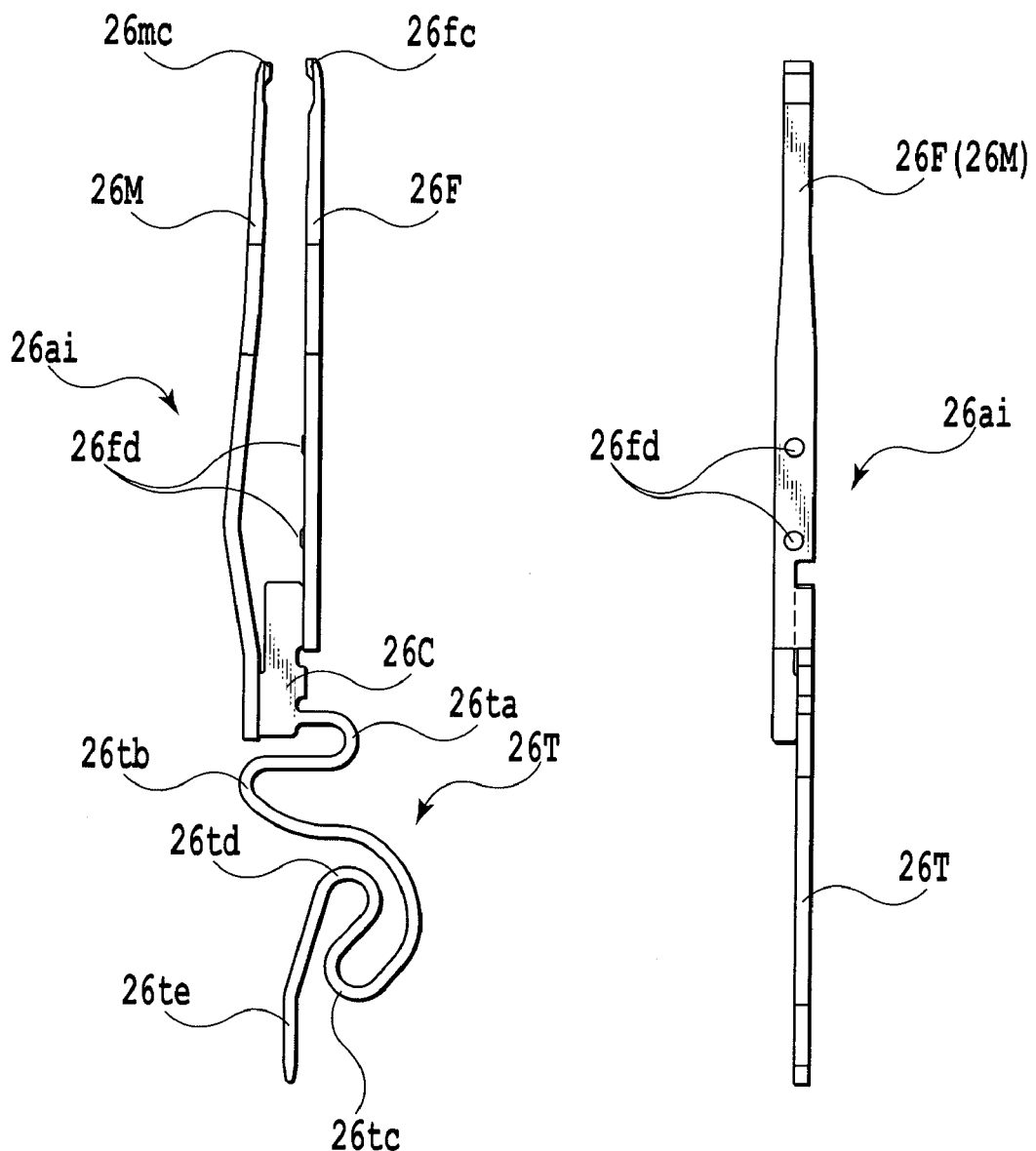
FIG. 1A is a front view showing a contact terminal used as an example of a semiconductor device socket according to the present invention.
FIG. 1B is a side view of FIG. 1A.

As enlarged in FIGS. 1A and 1B, the contact terminal 26ai is formed of an elastic thin-sheet metallic material integrally by presswork, and extends in a direction substantially orthogonal to the surface of the printed wiring board PB.

The contact terminal 26ai comprises a pair of movable side contact pieces 26M and 26F, a fixed side terminal 26T, and the fixing portion 26C, the pair of movable side contact pieces 26M and 26F for pinching or releasing the above-described ball-like electrode portion DVa of the semiconductor device DV, the fixed side terminal 26T having a contact point 26te on one end which comes into contact with the group of electrodes PBE of the printed wiring board PB, the fixing portion 26C for connecting proximal end portions of the pair of elastic movable side contact pieces 26M and 26F to other end of the fixed side terminal 26T.

The movable side contact piece 26M which is one of the pair is formed integrally with the fixing portion 26C so as to be capable of approaching or separating from the movable side contact piece 26F which is the other one of the pair. Contact points 26mc and 26fc coming into contact with the ball-like electrode portion DVa of the semiconductor device DV are formed respectively on upper end portions of the movable side contact pieces 26M and 26F face to face with each other. Each of the contact points 26mc and 26fc protrudes to a position in the vicinity of the positioning portion 22 through a slit in the slider member 24. Two protrusions 26fd are formed with a predetermined interval at respective portions of the movable side contact piece 26F in the vicinity of the fixing portion 26C, the protrusions 26fd provided to inhibit the movable side contact piece 26F from falling toward the movable side contact piece 26M at the time of attachment.

In addition, when the slider member 24 is moved in a direction indicated with an arrow in FIG. 17A, the contact points 26mc of the movable side contact pieces 26M are pressed by pressing portions 24pai (i=1 to n, n is a positive integer) of the slider member 24 as indicated with chain double-dashed lines and thus are caused to separate from the contact points 26fc of the movable side contact pieces 26f. On the other hand, when the slider member 24 is moved in an opposite direction to the direction indicated with the arrow and thus is moved back to an initial position from the separated position, the contact points 26mc of the movable side contact pieces 26M are caused to approach the contact points 26fc of the movable side contact pieces 26F.

The fixed side terminal 26T formed into a curved shape is elastic and has one end thereof joined to the fixing portion 26C. The fixed side terminal 26T comprises a plurality of curved portions 26ta, 26tb, 26tc, and 26td, and a contact point 26te which are continuously formed. Since the fixed side terminal 26T is formed of the plurality of curved portions as described above, a total length of the fixed side terminal 26T can be made relatively large, thereby allowing setting of a smaller spring constant. This avoids applying an excessive pressure to the contact point 26te when coming into contact with the group of electrodes PBE of the printed wiring board PB.

One end of the curved portion 26ta projecting in a convex manner on a movable side contact piece 26F side is formed integrally with a side face portion of the fixing portion 26C on a movable side contact piece 26F side. Integrally forming the one end of the curved portion 26ta with the side face portion allows the total length of the spring to be longer than the one obtained in the case of integrally forming the end of the curved portion 26ta in a position immediately below a lower surface portion of the fixing portion 26C. Thereby, the spring constant of the fixed side terminal 26T can be set smaller. The curved portion 26tb of a convex shape continuous with the other end of the curved portion 26*ta* is disposed in a position immediately below the proximal end of the movable side contact piece 26M.

Figure 18A:
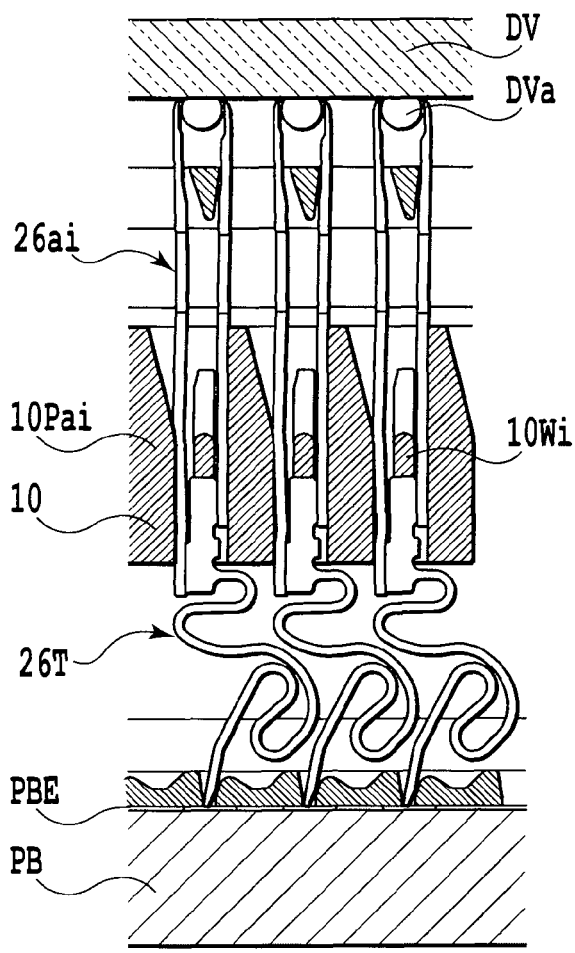
FIG. 18A is a partial cross-sectional view partially showing the configuration of the socket body in a state where the socket body in the example shown in FIG. 2 is fixed to a printed wiring board.

A distance from the curved portion 26*tb* to the curved portion 26*tc* is the longest part of the total length of the fixed side terminal 26T, i.e., the distance is set larger than a distance between the curved portion 26*ta* and the curved portion 26*tb*. The curved portion 26*td* formed in a convex manner adjacent to an upper part of the curved portion 26*tc* is formed so as to enter a concave portion formed in a portion extending from the curved portion 26*tb* to the curved portion 26*tc*. Besides, a gap between the curved portion 26*td* and the portion extending from the curved portion 26*tb* to the curved portion 26*tc* is set in advance so as to leave a predetermined clearance even when the fixed side terminal 26T is elastically displaced as shown in FIG. 18A.

In addition, forming the curved portion 26*td* adjacent to the upper part of the curved portion 26*tc* allows an effective use of a space of a height HA from a bottom surface portion of the alignment plate 14 to the partition walls 10Pai of the socket body 10 as shown in FIG. 17A. This also allows an increase in the total length of the spring. Thereby, the spring constant of the fixed side terminal 26T can be set smaller.

In FIG. 1A, a proximal end portion of the curved portion 26*tb* is formed so as to be bent at a predetermined angle relative to the contact point 26*te* in a direction to approach the portion extending from the curbed portion 26*tb* to the curved portion 26*tc*. For this reason, between any two adjacent contact terminals 26*ai*, it is possible to avoid the portion extending from the curved portion 26*tb* to the curved portion 26*tc* of one of the contact terminals 26*ai* from coming into contact with the curved portion 26*tb* of the other contact terminal 26*ai* each other.

Moreover, the contact point 26*te* formed on the other end of the fixed side terminal 26T comes into contact with the group of electrodes PBE of the printed wiring board PB at a predetermined pressure. Accordingly, this eliminates the need for a soldering operation of the fixed side terminals 26T of the contact terminals 26*ai* onto the electrode group PBE of the printed wiring board PB.

Figure 2:
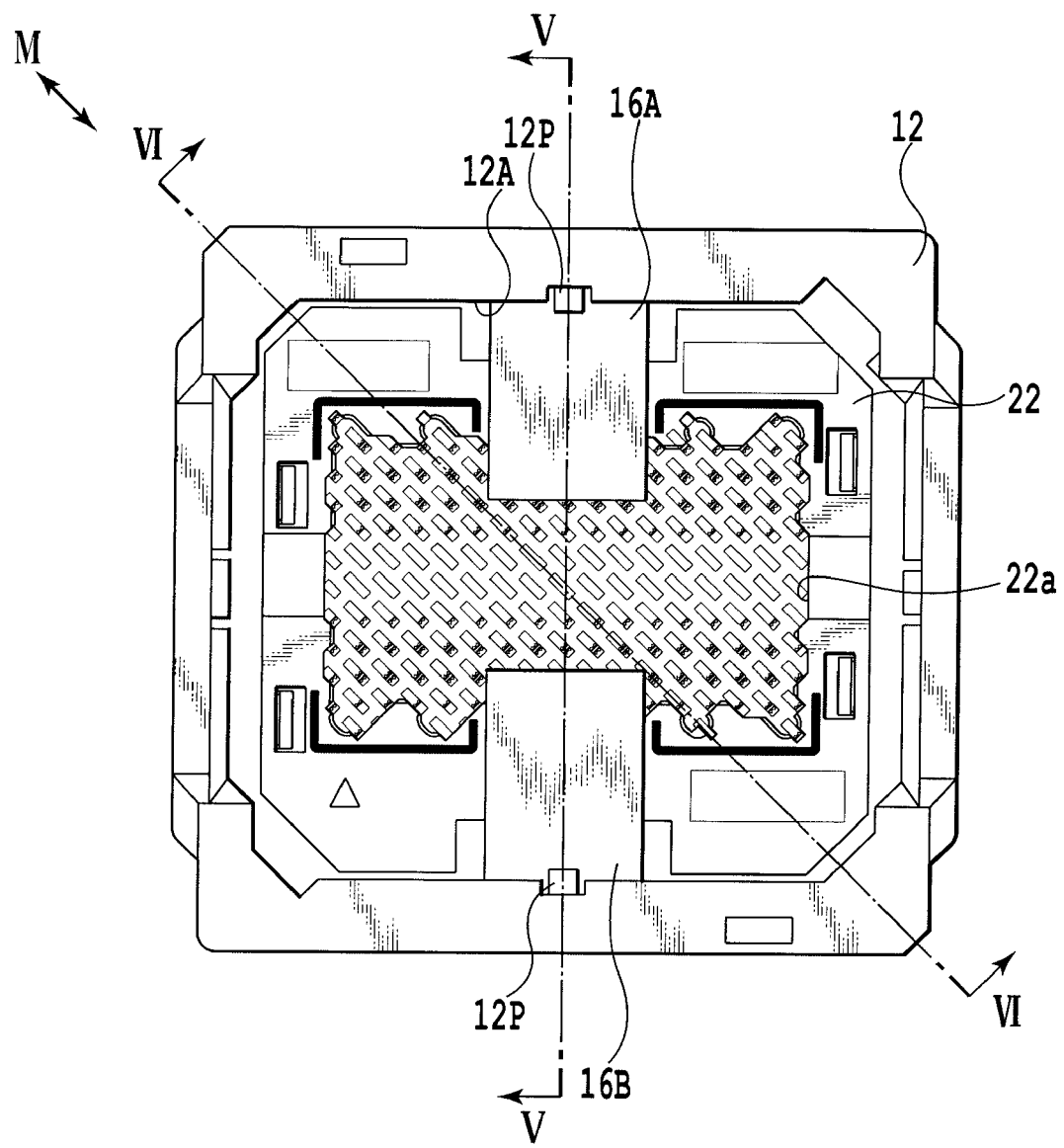
FIG. 2 is a plan view showing an example of a semiconductor device socket according to the present invention.

The slider member 24 and the positioning portion 22 are caused to reciprocate in a direction indicated with an arrow M in FIG. 2, i.e., along the above-described diagonal line, by a cam mechanism in response to a descending action of the cover member 12. The cam mechanism includes a cam piece 12CA and an engaged portion (not shown) as shown in FIG. 6, for example. The cam piece 12CA is integrally formed with the cover member 12 and protrudes toward the slider member 24, and the engaged portion (not shown) is formed in the slider member 24 and engaged with the cam piece 12CA.

Besides, a driving mechanism of the slider member 24 may be configured by including a lever member and a coil spring as disclosed in Japanese Patent Laid-Open No. 2003-17207, for example.

In addition, the slider member 24 includes slits 24*bi* (i=1 to n, n is a positive integer) through each of which the contact portions 26*mc* and 26*fc* of the pair of the movable side contact pieces 26M and 26F of the contact terminal 26*ai* pass, the slits 24*bi* provided so as to correspond to the above-described cells 10Si of the socket body 10. Any two adjacent slits 24*bi* on the same row are partitioned by the pressing unit 24*pai* (i=1 to n, n is a positive integer). Any two slits 24*bai* provided on adjacent and different rows are partitioned by a dividing wall.

As shown in FIG. 2, the positioning unit 22 placed on the slider member 24 includes a semiconductor device accommodating portion 22*a* on which the semiconductor device DV is placed. At an inner peripheral portion, the semiconductor device accommodating portion 22*a* includes a guiding member for positioning the electrode units DVa of the semiconductor device DV relative to the respective contact points of the contact terminals 26*ai*. Inside the semiconductor device accommodating portion 22*a*, as enlarged in FIG. 6, the contact points at the movable side contact pieces of the above-described contact terminals 26*ai* protrude in a range not exceeding a mounting surface for the semiconductor device DV of the positioning unit 22. Besides, the positioning unit 22 is not limited to this example and may be formed integrally with the slider member 24, for example.

The cover member 12 has an opening portion 12A in the center thereof. The above-described positioning portion 22 of the slider member 24 is movably disposed therebelow. When the semiconductor device DV is attached to and detached from the positioning portion 22, the semiconductor device DV passes through the opening portion 12A.

Figure 4:
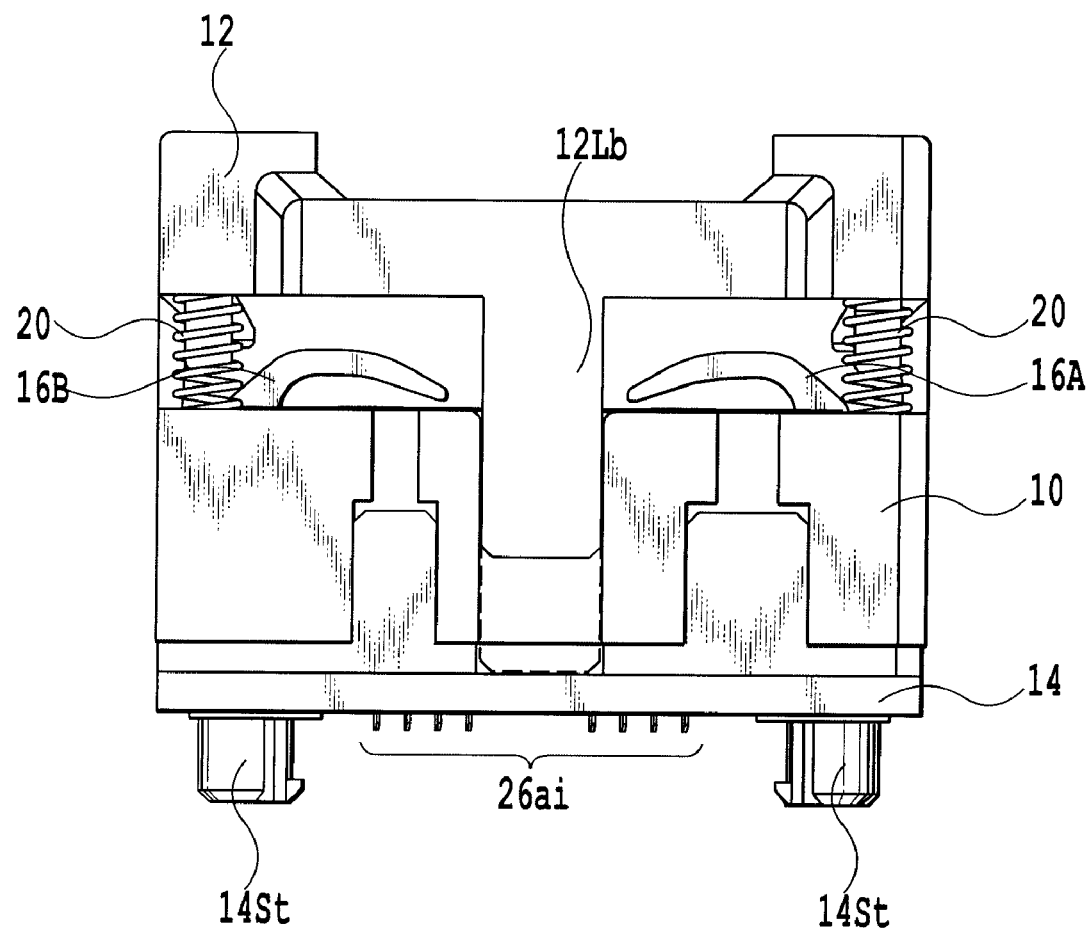
FIG. 4 is a side view of the example shown in FIG. 2.

As shown in FIG. 3 and FIG. 4, a plurality of leg portions 12La and 12Lb of the cover member 12 are respectively guided by grooves formed in an peripheral portion of the socket body 10 and are supported by the grooves in a vertically movable manner. Only one of the plurality of leg portions 12La and 12Lb is shown in each of FIG. 3 and FIG. 4.

In addition, as shown in FIG. 6, a plurality of pieces of coil springs 20 are provided each between a spring guide rod 12G on the cover member 12 and the hole 10R in the socket body 10. The coil springs 20 are configured to bias the cover member 12 upward, i.e., in a direction to cause the cover member 12 to separate from the socket body 10. In this case, nib portions provided on tip end portions of the leg portions 12La and 12Lb of the cover member 12 are engaged with ends of the grooves. Accordingly, the cover member 12 is retained in an uppermost end position as shown in FIG. 3 and FIG. 4. Note that FIG. 3 to FIG. 6 respectively show a state where the cover member 12 is retained in the uppermost end position.

The cover member 12 includes the arm portions 12P which press the proximal end portions of the pressing members 16A and 16B when the cover member 12 is caused to descend, the pressing members 16A and 16B constituting the latch mechanism.

Each of the pressing members 16A and 16B is rotatably supported in a position of the socket body 10 corresponding to each long side of the positioning portion 22. In addition, each of the proximal end portions of the pressing members 16A and 16B is biased by a coil spring 18 as shown in FIG. 3 in a direction so as to press by a tip end portion thereof the semiconductor device DV mounted on the positioning portion 22. In this way, the tip end portions of the pressing members 16A and 16B are disposed in positions above the positioning portion 22. On the other hand, when the proximal end portions of pressing members 16A and 16B are pressed by the arm portions 12P of the cover member 12 against the biasing force of the coil spring 18, the tip end portions of the pressing members 16A and 16B are separated from the positioning portion 22 and disposed in predetermined standby positions.

Figure 12:
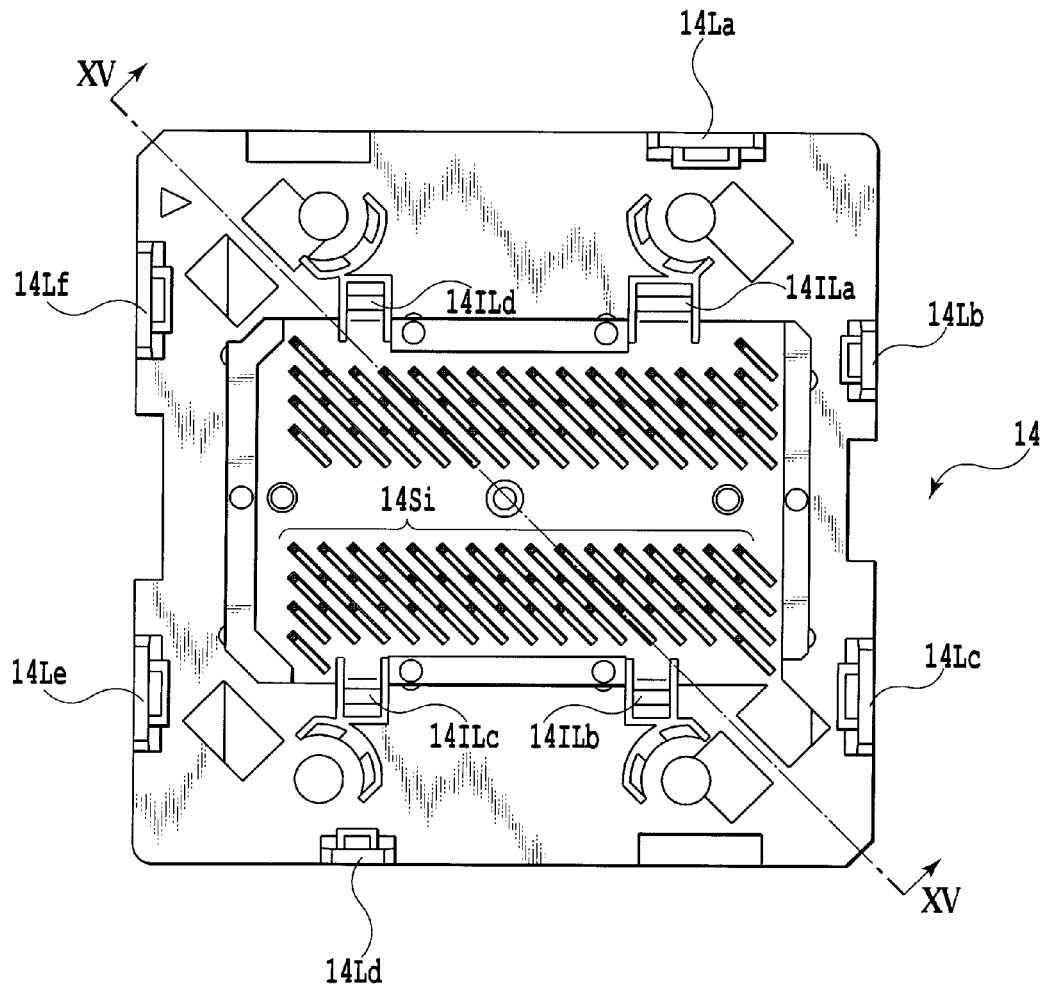
FIG. 12 is a plan view showing an alignment plate used in the example shown in FIG. 2.
Figure 13:
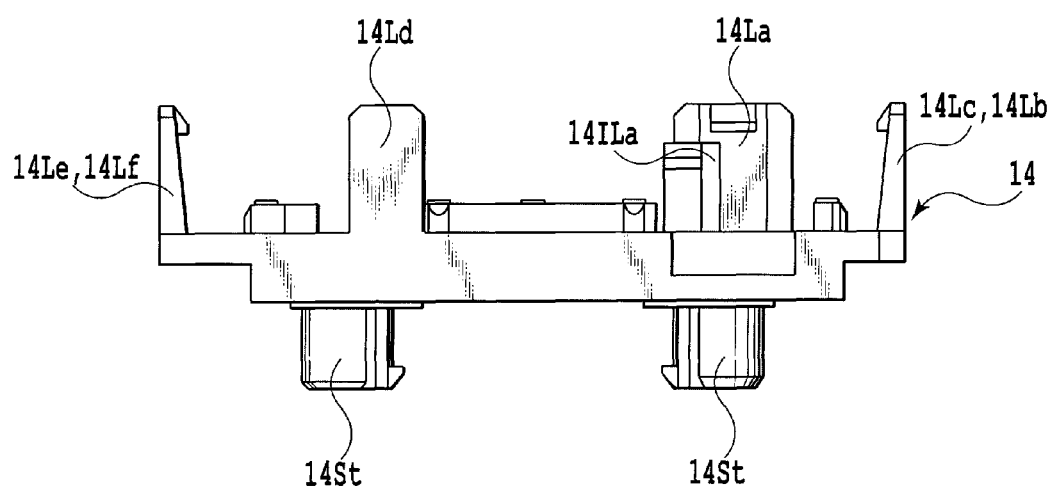
FIG. 13 is a front view of FIG. 12.
Figure 14:
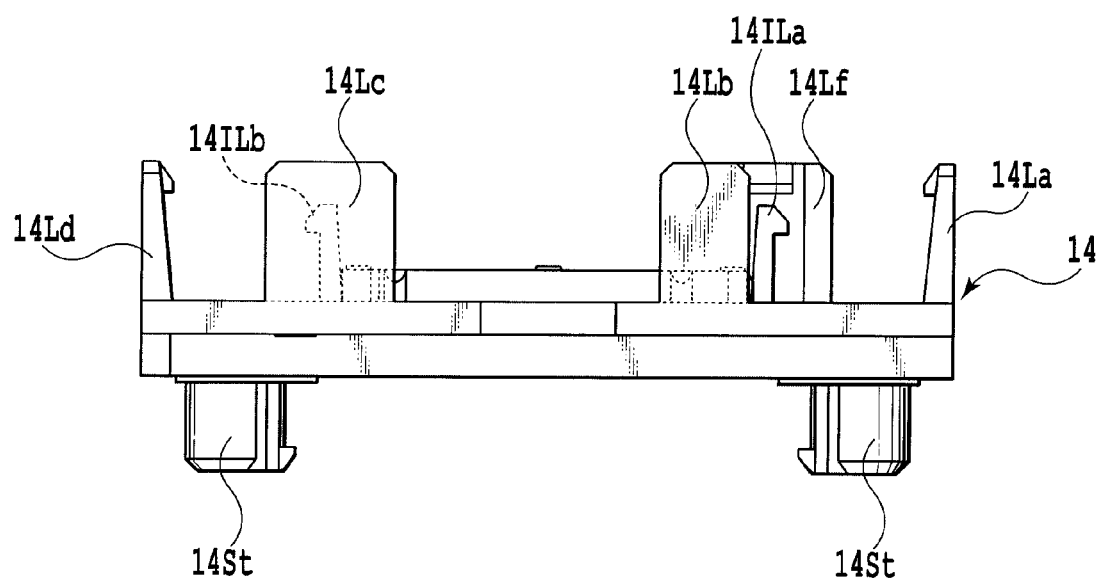
FIG. 14 is a side view of FIG. 12.

Moreover, as shown in FIG. 12 to FIG. 14, the alignment plate 14 having fixed nib portions 14St integrated therewith in four positions at given intervals is disposed at a bottom part of the socket body 10 placed on the surface of the printed wiring board PB.

As enlarged in FIG. 13 and FIG. 14, each of the fixed nib portions 14St protrudes toward the surface of the printed wiring board PB so as to be substantially perpendicularly to the bottom surface portion. Each of the fixed nib portions 14St includes bifurcated lock pieces that are separated from each other. A hole (not shown) into which a machine screw Bs is inserted is formed between the lock pieces.

Respective locking parts protruding outward from tip ends of the lock pieces are elastically displaceable in direction so as to approach or separate from each other. That is, the respective locking parts are capable of approaching each other so that the respective locking parts can pass through the above-described fixed hole and of separating from each other so that the respective locking parts can be fixed on the periphery of an opening edge of the fixed hole on the lower surface side.

When the respective lock pieces are to be fixed to the printed wiring board PB, the locking part are brought into contact with the periphery of the opening edge of the fixed hole formed on the lower surface of the printed wiring board PB as the machine screw Bs is screwed into the hole. Besides, when the respective lock pieces are taken out of the printed wiring board PB, the machine screw Bs is easily taken out of the hole.

Nib portions 14La, 14Lb, 14Lc, 14Ld, 14Le, and 14Lf to be fixed on the above-described protrusions 10NA and 10NB of the socket body 10 are formed on a peripheral portion of the alignment plate 14. The nib portions 14La to 14Lf protrude toward the socket body 10 substantially perpendicularly to the bottom surface portion of the alignment plate 14.

Elongated grooves 14Si (i=1 to n, n is a positive integer) are formed in the center portion of the alignment plate 14 so as to correspond to the cells 10Si of the socket body 10. Nibs 14ILa, 14ILb, 14ILc, and 14ILd to be fixed on the above-described nib portions 10INA and 10INB of the socket body 10 are formed around the group of grooves 14Si. The nibs portions 14ILa to 14ILd are formed to face one another substantially in parallel.

Figure 15:
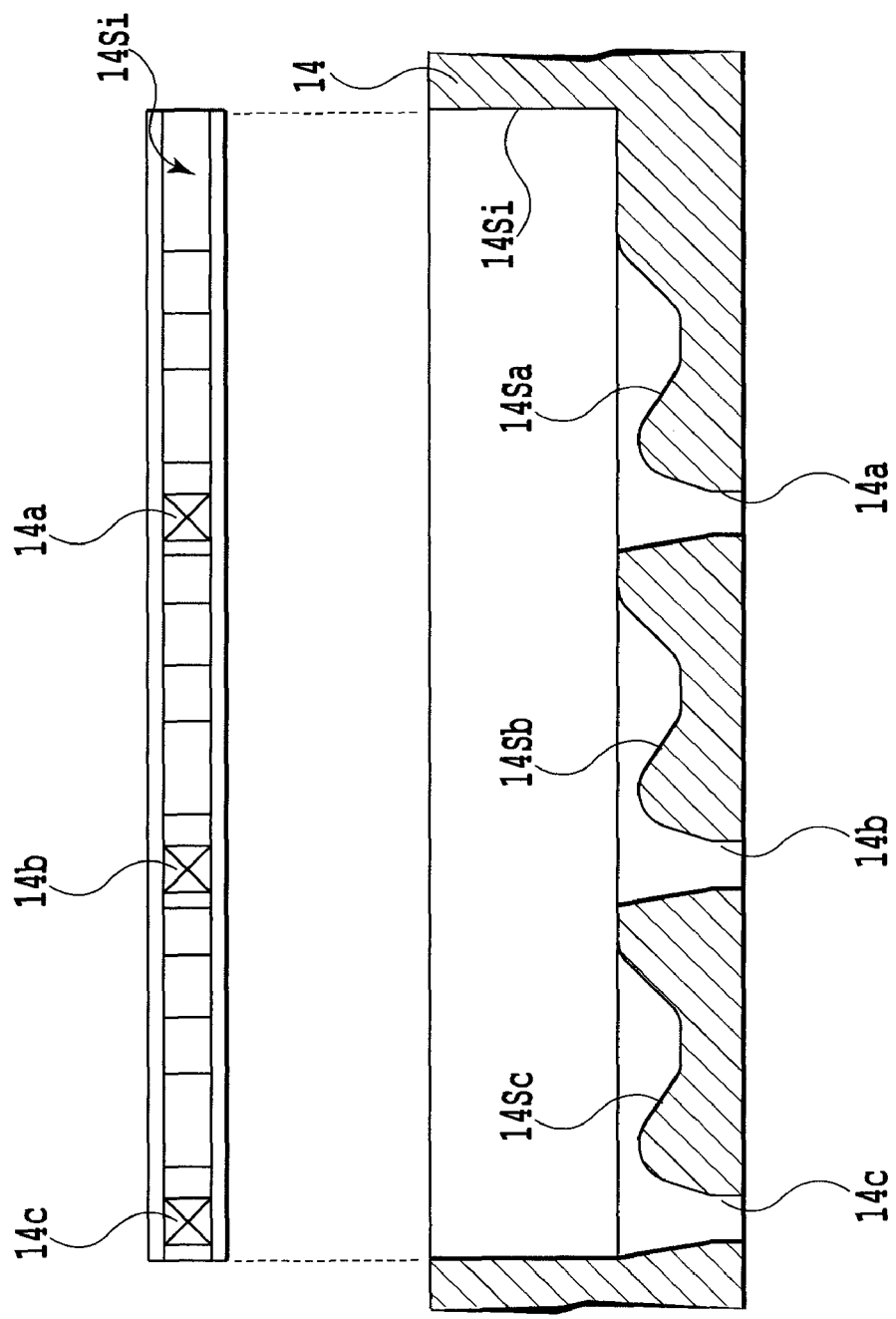
FIG. 15 is a partial cross-sectional view shown along a line XV-XV of FIG. 12.

As enlarged in FIG. 15, holes 14a, 14b, and 14c are formed in the bottom portion in which the grooves 14Si are provided. The holes 14a, 14b, and 14c allow the contact points 26te of the fixed side terminals 26T of three contact terminals 26ai to be inserted and allow tip end portions thereof to protrude outward. The holes 14a, 14b, and 14c are formed in a line at given intervals. Recesses 14Sa, 14Sb, and 14Sc for positioning the curved positions 26tc of the fixed side terminals 26T are formed around the respective holes 14a, 14b, and 14c. Each of cross-sectional shape of the recesses 14Sa to 14Sc is formed into a curved shape corresponding to the shape of the curved portion 26tc. When the contact terminals 26ai are arranged on the alignment plate 14 as shown in FIG. 17A, the height HA from the bottom surface portion of the alignment plate 14 to the partition walls 10Pai of the socket body 10 is set to within several millimeters in FIG. 17A.

Figure 16:
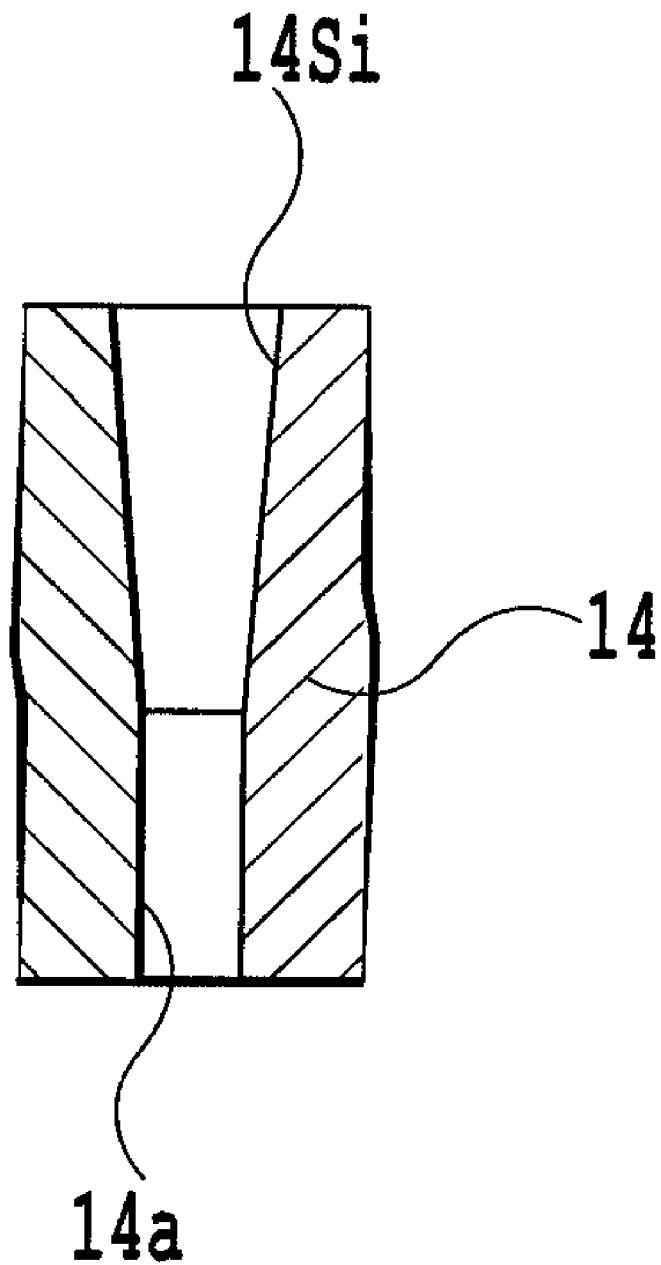
FIG. 16 is a partial cross-sectional view showing a shape of a groove in FIG. 15.

As enlarged in FIG. 16, a cross-sectional shape of each groove 14Si is formed into a tapered shape toward any of the recesses 14Sa to 14Sc and the corresponding one of the holes 14a to 14c.

Figure 17B:
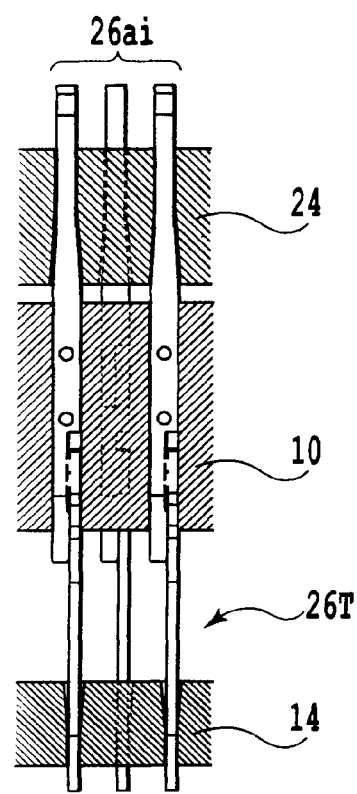
FIG. 17B is a partial cross-sectional view as seen from the lateral side of FIG. 17A.
Figure 18B:
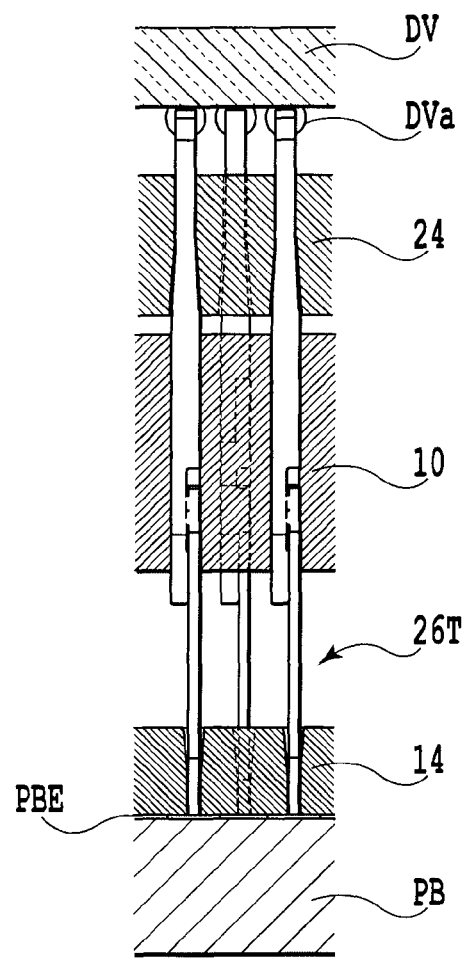
FIG. 18B is a partial cross-sectional view as seen from the lateral side of FIG. 18A.

In a case where the socket body 10 and the alignment plate 14 are assembled together as shown in FIGS. 17A and 17B and are then attached to the printed wiring board PB, the contact points 26te of the fixed terminals 26T of the contact terminals 26ai are pushed back into the holes 14a to 14c while the protruding tip ends of the contact points 26te come into contact with the electrode group of the printed wiring board PB as shown in FIG. 18A and FIG. 18B. In this way, the fixed side terminals 26T of the contact terminals 26ai are electrically connected to the electrode group of the printed wiring board PB.

When a test of the semiconductor device DV is conducted according to the above-described configuration, a pressing surface portion of a pressing member provided on an unillustrated conveyor robot is firstly brought into contact with an upper surface of the cover member 12 and is pressed downward at a given stroke against the above-described biasing force of the coil springs 20.

In this way, the pressing members 16A and 16 separate from each other and are set in the standby positions. In addition, the semiconductor device DV serving as an object to be tested, for example, is suction-held by an unillustrated conveyor arm of the conveyor robot and conveyed to a position immediately above the opening portion 12A of the cover member 12 and above the positioning portion 22.

The semiconductor device DV suction-held by the conveyor arm is then caused to descend through the opening portion 12A of the cover member 12 and is disposed and mounted on the semiconductor device accommodating portion 22a of the positioning portion 22. Subsequently, when the above-described pressing surface portion of the pressing member is lifted up while coming into contact with the upper surface of the cover member 12, the cover member 12 is lifted up to the uppermost end position by means of the above-described biasing force of the coil springs 20 and the like. In this case, contact portions at the tip ends of the pressing members 16A and 16B are rotated substantially at the same timing, thereby pressing the semiconductor device DV toward the contact terminals 26ai.

Thereafter, in a case where an inspection signal is supplied to an input-output unit of the printed wiring board PB while the cover member 12 is maintained in the uppermost end position, if the inspection signal is supplied to the semiconductor device DV through the contact terminals 26ai and an anomaly of that circuit is detected, an anomaly detection signal from the semiconductor device DV is supplied to an external failure diagnostic device through the input-output unit.

Besides, as disclosed in Japanese Patent Laid-Open No. 2006-071375, the function of the cover member 12 may be alternatively provided to a material handling unit of the conveyor robot.

Figures 19A, 19B:
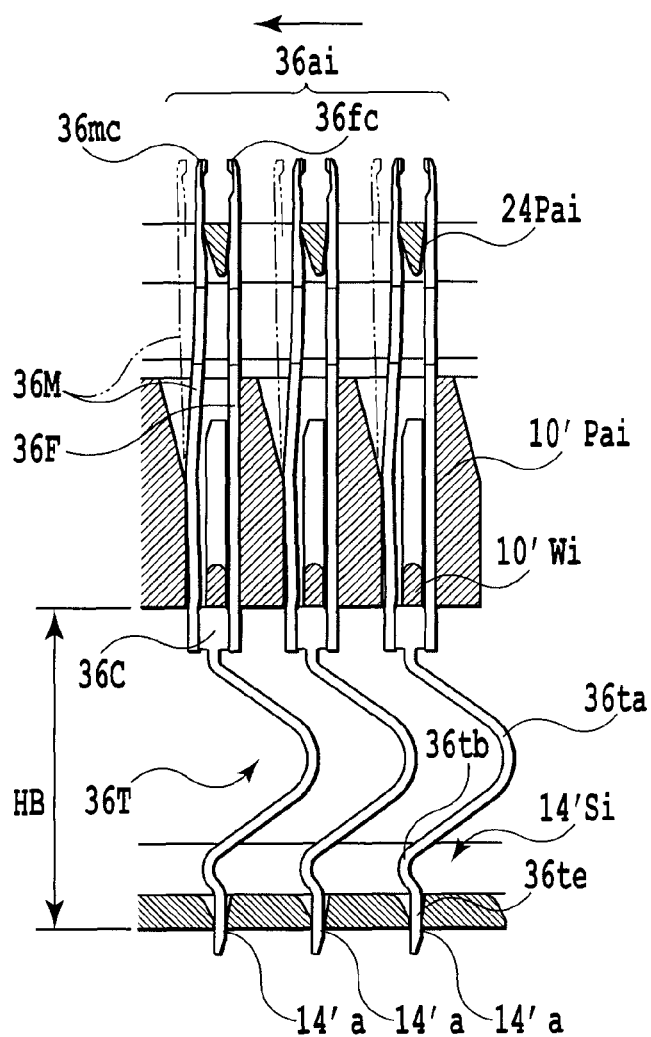
FIG. 19A is a partial cross-sectional view partially showing an example of another contact terminal used in the example of the semiconductor device socket according to the present invention together with the socket body.
FIG. 19B is a partial cross-sectional view as seen from the lateral side of FIG. 19A.

FIGS. 19A and 19B schematically show another example of contact terminals to be used in the example of the semiconductor device socket according to the present invention together with the slider member 24, a socket body 10', and an alignment plate 14'. Besides, in FIGS. 19A and 19B as well as FIGS. 20A and 20B, constituents deemed to be identical constituents to those in the example shown in FIG. 6 will be denoted by identical reference numerals and redundant explanations thereof will be omitted.

The fixed side terminal 26T of the contact terminal 26ai shown in FIG. 1A includes the plurality of curved portions, namely, the curved portions 26ta, 26tb, 26tc, and 26td, and the contact point 26te, which are continuously formed. On the other hand, a fixed side terminal 36T of a contact terminal 36ai in FIGS. 19A and 19B includes two curved portions 36ta and 36tb as the plurality of curved portions, and a contact point 36te.

As enlarged in FIG. 19A, any two adjacent cells formed at a given interval on a common straight line are partitioned by a partition wall 10'Pai (i=1 to n, n is a positive integer) which extends in a direction substantially orthogonal to the surface of the printed wiring board PB. The partition wall 10'Pai is formed so as to be tapered toward the upper surface portion of the contact accommodating portion. Press-fitting portions configured to support the fixing portion 36C of the contact terminal 36ai by use of wall surfaces are formed on both sides of an intermediate wall 10'Wi (i=1 to n, n is a positive integer) formed inside a cell so as to divide the cell.

Holes 14'a are formed in a bottom portion of the alignment plate 14' in which grooves 14'Si are formed. The contact points 36*te* of the fixed side terminals 36T of three contact terminals 36*ai* are inserted into the holes 14'*a*, and tip end portions thereof protrude to the outside.

The contact terminal 36*ai* is formed of an elastic thin-plate metallic material integrally by press work, and extends in a direction substantially orthogonal to the surface of the printed wiring board PB.

The contact terminal 36*ai* is configured by including a pair of movable side contact pieces 36M and 36F, a fixed side terminal 36T, and the fixing portion 36C, the pair of movable side contact pieces 36M and 36F pinching or releasing the above-described ball-like electrode portion DVa of the semiconductor device DV, the fixed side terminal 36T having the contact point 36*te* on one end which comes into contact with the electrode group PBE of the printed wiring board PB, the fixing portion 36C connecting proximal end portions of the pair of elastic movable side contact pieces 36M and 36F to another end of the fixed side terminal 36T.

The movable side contact piece 36M which is one of the pair is formed integrally with the fixing portion 36C so as to be capable of approaching or separating from the movable side contact piece 36F which is the other one of the pair. Contact points 36*mc* and 36*fc* coming into contact with the ball-like electrode portion DVa of the semiconductor device DV are formed respectively on upper end portions of the movable side contact pieces 36M and 36F that face each other. Each of the contact points 36*mc* and 36*fc* protrudes to a position in the vicinity of the positioning portion 22 through a slit in the slider member 24.

In addition, when the slider member 24 is moved in a direction indicated with an arrow in FIG. 19A, the contact points 36*mc* of the movable side contact pieces 36M are pressed by pressing portions 24*pai* of the slider member 24 as indicated with chain double-dashed lines and thus are caused to separate from the contact points 36*fc* of the movable side contact pieces 36F. On the other hand, when the slider member 24 is moved in an opposite direction to the direction indicated with the arrow and thus is moved back to an initial position from a separated position, the contact points 36*mc* of the movable side contact pieces 36M are caused to approach the contact points 36*fc* of the movable side contact pieces 36F.

The fixed side terminal 36T formed into a curved shape is elastic and has one end thereof joined to the fixing portion 36G. The fixed side terminal 36T of the curved shape includes a curved portion 36*ta* and a curved portion 36*tb*. The curved portion 36*ta* has a relative large curvature radius, and the curved portion 36*tb* is continuous with another lower end of the curved portion 36*ta* and has a smaller curvature radius than the curvature radius of the curved portion 36*ta*. The curved portion 36*ta* is formed in a convex manner on a movable side contact piece 36F side while the curved portion 36*tb* is formed in a convex manner on the movable side contact piece 36M side. The fixed side terminal 36T includes a straight contact point 36*te* at a bottom end. Since the fixed side terminal 36T is formed of the multiple curved portions as described above, a total length of the fixed side terminal 36T can be made relatively large, thereby allowing setting of a smaller spring constant.

Besides, when the contact terminals 36*ai* are arranged on the alignment plate 14' as shown in FIG. 19A, a height HB from the bottom surface portion of the alignment plate 14' to the partition walls 10'Pai of the socket body 10' is set to within several millimeters in FIG. 19A.

This prevents the contact point 36*te* from applying an excessive pressure upon coming into contact with the electrode group PBE of the printed wiring board PB when the spring constant of the fixed side terminal 36T is set relatively small. One end of the curved portion projecting in a convex manner on the movable side contact piece 36F side is formed integrally with the lower end of the fixing unit 36C.

Figure 20A:
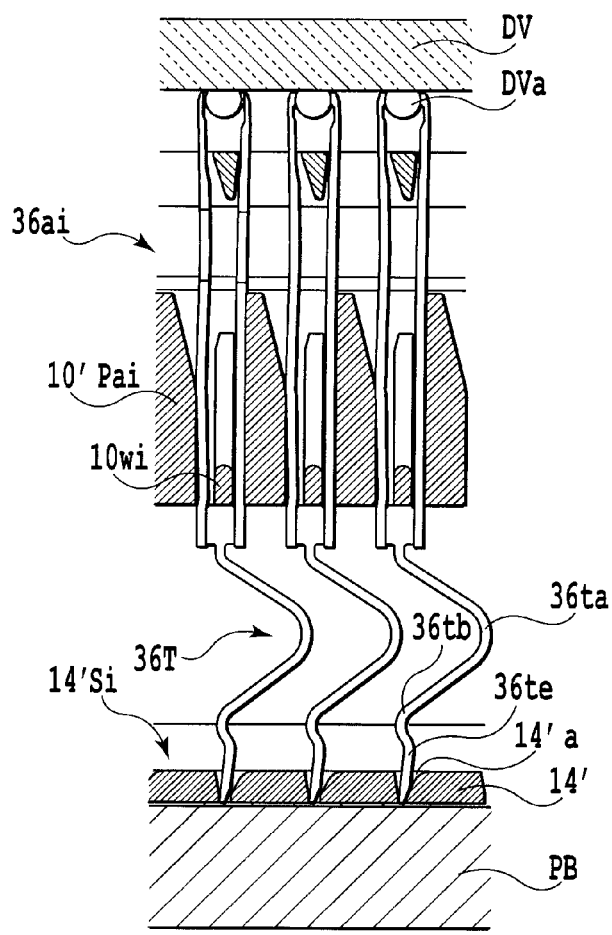
FIG. 20A is a partial cross-sectional view partially showing the configuration of the socket body in a state where the socket body shown in FIG. 19A is fixed to the printed wiring board.
Figure 20B:
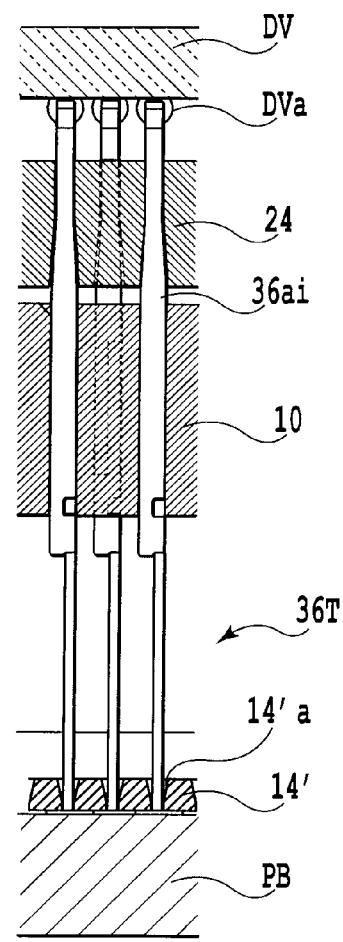
FIG. 20B is a partial cross-sectional view as seen from the lateral side of FIG. 20A.

Moreover, in a case where the socket body 10' and the alignment plate 14' are assembled together and are then mounted on the printed wiring board PB, the contact point 36*te* of the fixed terminal 36T of the contact terminal 36*ai* is pushed back into the hole 14'*a* while the protruding tip end portion of the contact point 36*te* comes into contact with the electrode group of the printed wiring board PB as shown in FIGS. 20A and 20B. In this way, the contact point 36*te* formed on the other end of the fixed side terminal 36T comes into contact with the electrode group PBE of the printed wiring board PB at a predetermined pressure as enlarged in FIGS. 20A and 20B. That is, the fixed side terminals 36T of the contact terminals 36*ai* are electrically connected to the electrode group of the printed wiring board PB. Accordingly, this eliminates the need for a soldering operation of the fixed side terminals 36T of the contact terminals 36*ai* onto the electrode group PBE of the printed wiring board PB.

In the above-described example, the example of the semiconductor device socket according to the present invention is applied to the socket having the configuration which allows the slider member 24 to move along a direction of movement of the mobile side contact piece 26M of the contact terminal 26*ai*. However, it is needless to say that the invention is not limited only to this example and is applicable to a socket having a configuration which allows a slider member to move in a direction substantially orthogonal to the direction of movement of a movable side contact piece of a contact terminal as disclosed also in Japanese Patent Laid-Open No. 2006-071375, for example.

The invention claimed is:

1. A semiconductor device socket comprising:
a socket body adapted to be disposed on a wiring board having an electrode surface on which an electrode group is formed, the socket body having a semiconductor device accommodating portion in which a semiconductor device is housed detachably and attachably;
a contact terminal being disposed on said socket body, said contact terminal having a pair of movable side contact pieces, a fixed side terminal, and a fixing portion, said contact terminal for connecting a terminal of the semiconductor device electrically to the electrode surface of the wiring board, the pair of movable side contact pieces being elastic and pinching the terminal of the semiconductor device, the fixed side terminal having a plurality of curved portions formed to be continuous with each of the contact pieces and elastically displaceable in a direction orthogonal to the electrode surface of the wiring board and a contact point which comes into contact with the electrode surface of the wiring board, the fixing portion for connecting proximal end portions of the pair of movable side contact pieces of said contact terminal to another end of the fixed side terminal;
a slider member having a pressing portion which moves at least one movable side contact piece of the paired movable side contact pieces of said contact terminal so as to cause the one movable side contact piece to approach or to separate from the other movable side contact piece each other; and
a slider driving mechanism which causes the pressing portion of said slider member operate so that the pair of movable side contact pieces of said contact terminal are brought into contact with or separated from the terminal of the semiconductor device, wherein an end of the curved portions is directly connected to a side edge of the fixing portion, and wherein said curved portions comprise a first curved portion extending upward from the contact point coming into contact with the electrode surface of the wiring board, and a second curved portion having a first end which is continuous with one end of the first curved portion and which, adjacent the first end, extends downward and the second curved portion also extends upward, after extending downward, toward a second end of the second curved portion and the second end of the second curved portion is the end of the curved portions directly connected to a side edge of the fixing portion.

2. The semiconductor device socket according to claim 1, wherein an alignment plate which aligns the fixed side terminal of said contact terminal is provided on a bottom surface portion of said socket body, said alignment plate having a fixed nib portion which is attachable to and detachable from a mounting hole in the wiring board.

3. The semiconductor device socket according to claim 2, wherein the number of the plurality of curved portions is at least four, the curved portions formed continuously with one another.

4. The semiconductor device socket according to claim 1, wherein protrusions are formed to inhibit one movable side contact piece from falling toward the other movable side contact piece.

5. The semiconductor device socket according to claim 2, wherein the alignment plate has holes which allow the contact points of the fixed side terminals of the contact terminals to be inserted and recesses for positioning the second curved positions of the fixed side terminals which are formed around the respective holes.

6. The semiconductor device socket according to claim 3, wherein the second curved portion includes a third curved portion and a fourth curved portion formed continuously between the first curved portion and the fixing portion.

* * * * *